(12) United States Patent
Oikawa

(10) Patent No.: US 6,412,134 B1
(45) Date of Patent: Jul. 2, 2002

(54) CLEANING DEVICE AND SUBSTRATE CLEANING APPARATUS

(75) Inventor: Fumitoshi Oikawa, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/456,496

(22) Filed: Dec. 8, 1999

(30) Foreign Application Priority Data

Dec. 8, 1998  (JP) .......................................... 10-348572

(51) Int. Cl.$^7$ ................................................. B08B 1/04
(52) U.S. Cl. ........................... 15/102; 15/97.1; 15/230; 15/230.16; 15/230.17; 15/230.19; 15/244.1
(58) Field of Search ................ 15/97.1, 102, 147.1, 15/154, 229.13, 230, 230.16–230.19, 244.1, 244.3, 244.4; D32/40, 52

(56) References Cited

U.S. PATENT DOCUMENTS

| | | | |
|---|---|---|---|
| 339,652 A | * 4/1886 | Horton | 15/244.1 X |
| 1,939,612 A | * 12/1933 | Rose | 15/244.1 X |
| 2,572,178 A | * 10/1951 | Monroe et al. | 15/154 |
| 2,820,234 A | * 1/1958 | Rigney | 15/244.1 X |
| 2,964,772 A | * 12/1960 | Crawford | 15/224.1 |
| 3,067,450 A | * 12/1962 | Mirth | 15/244.1 X |
| 3,100,311 A | * 8/1963 | Tutino | 15/229.13 |
| 4,546,514 A | * 10/1985 | Tutino | 15/229.13 |

FOREIGN PATENT DOCUMENTS

| | | | |
|---|---|---|---|
| FR | 2390147 | * 12/1978 | 15/97.1 |
| JP | 9-134896 | 5/1997 | |
| JP | 9-181025 | 7/1997 | |
| JP | 10-92780 | 4/1998 | |
| SU | 1646540 | * 5/1991 | 15/97.1 |

* cited by examiner

Primary Examiner—Mark Spisich
(74) Attorney, Agent, or Firm—Wenderoth, Lind & Ponack, L.L.P.

(57) ABSTRACT

A cleaning device for use in a substrate cleaning apparatus is disclosed. The cleaning device includes a cleaning member brought into contact with a surface of a substrate to be cleaned, and a cleaning member holding mechanism for holding the cleaning member. The cleaning member holding mechanism includes a holding member (sleeve) having a lower portion split into a plurality of chuck jaws, and a ring member fitted onto the outer periphery of the holding member. An end portion of the cleaning member is inserted into an insertion hole formed by the chuck jaws, and the ring member is fitted onto the outer periphery of the holding member, thereby holding the cleaning member with the chuck jaws. That is, the cleaning member holding mechanism has a collet chuck structure.

18 Claims, 10 Drawing Sheets

CLEANING DEVICE AND SUBSTRATE CLEANING APPARATUS

BACKGROUND OF THE INVENTION

The present invention relates to a cleaning device for use in a cleaning apparatus in which a cleaning fluid is supplied onto a substrate to be cleaned, e.g. a semiconductor wafer, which is being rotated in a horizontal position, and while doing so, the substrate is cleaned with the cleaning device. The present invention also relates to a substrate cleaning apparatus using the above-described cleaning device.

Figure 1:
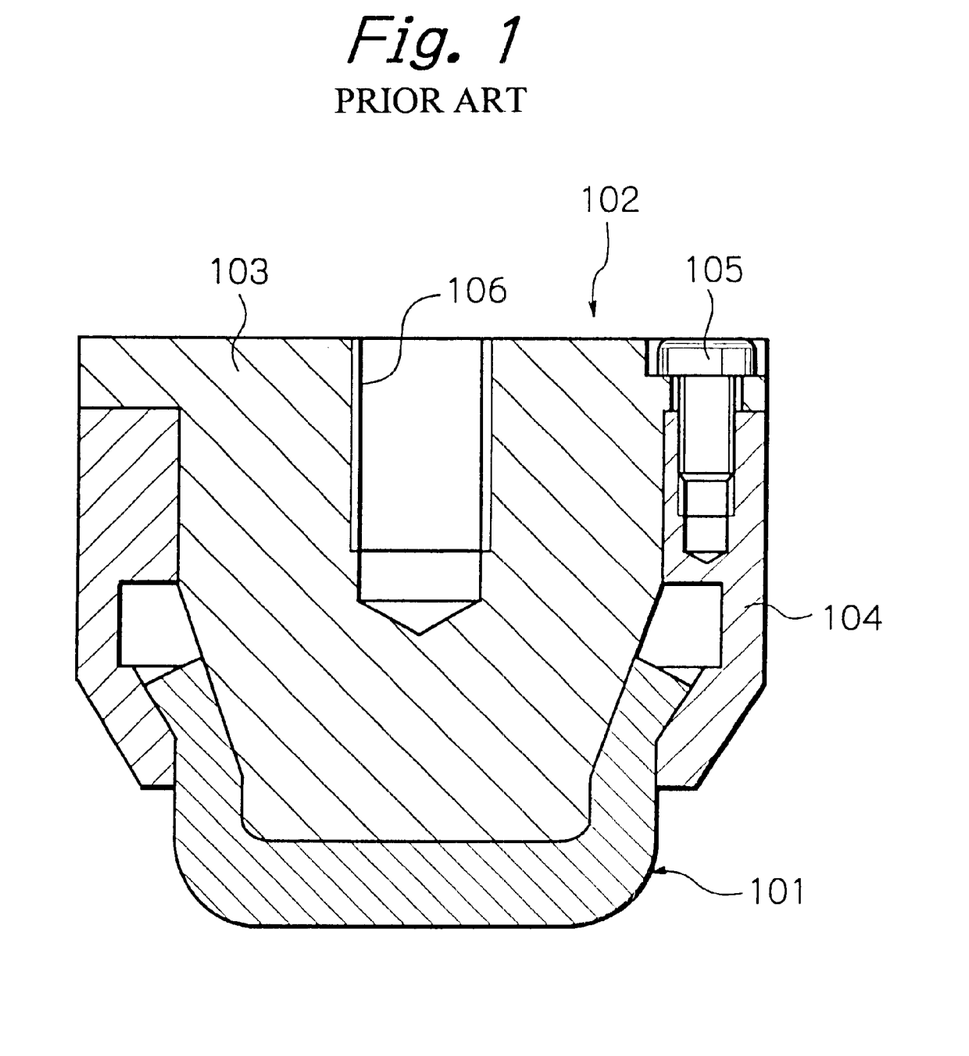
FIG. 1 is a sectional view showing a structural example of the conventional cleaning devices.

A conventional cleaning device of the type described above has a structure shown in FIG. 1. The cleaning device, as shown in FIG. 1, includes a disk-shaped sponge member 101, which is a cleaning member, and a cleaning member holding mechanism 102 for holding the sponge member 101. The cleaning member holding mechanism 102 includes a columnar holder body 103 having a frusto-conical portion at the lower end thereof and a collar portion at the upper end thereof. The cleaning member holding mechanism 102 further includes a ring member 104 fitted on the outer peripheral portion of the holder body 103. The lower end portion of the ring member 104 is drawn so as to form a predetermined gap between itself and the outer periphery of the frusto-conical portion of the holder body 103.

With the sponge member 101 placed in abutment on the frusto-conical portion of the holder body 103, the ring member 104 is fitted onto the outer peripheral portion of the holder body 103, thereby holding the sponge member 101 between the outer periphery of the holder body 103 and the inner periphery of the ring member 104. Thus, the sponge member 101 is fitted in the cleaning member holding mechanism 102. The holder body 103 is provided with a tapped hole 106 for threaded engagement with the distal end of a rotating shaft for holding and rotating the cleaning device. The holder body 103 and the ring member 104 are secured to each other with a screw 105. However, the cleaning device having the above-described structure suffers from some problems as stated below.

① Because the sponge member 101 is held between the holder body 103 and the ring member 104, a jig is needed to correctly fit the sponge member 101 into the cleaning member holding mechanism 102, and some experience is required to carry out the fitting operation.

Figure 5A:
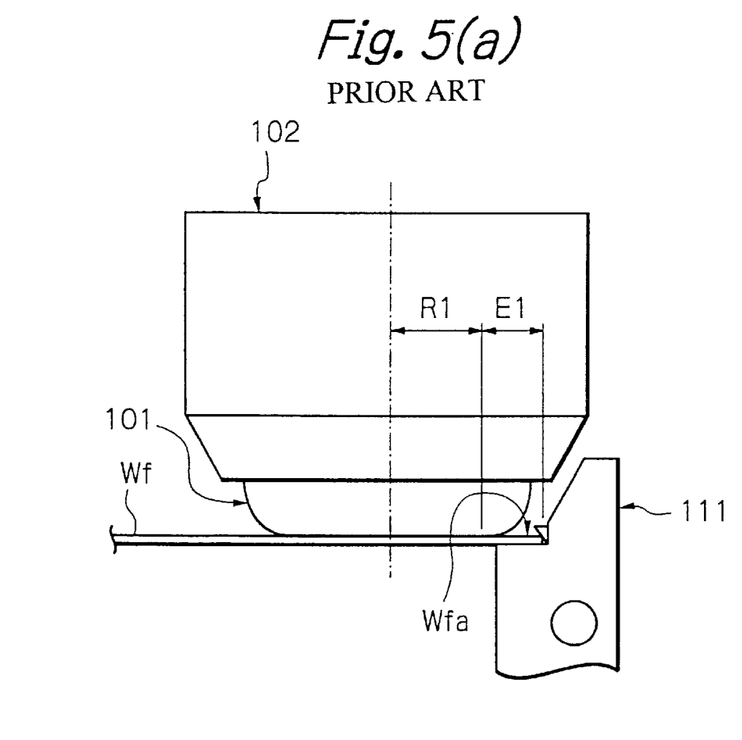
FIG. 5(a) shows an example of the conventional cleaning devices.

② As shown in FIG. 5(a), the sponge member 101 and the cleaning member holding mechanism 102 are moved in approximately the diametrical direction of a substrate Wf to be cleaned with the sponge member 101 placed in contact with the rotating substrate Wf within a range in which there is no interference between a projection (chuck) 111 of a substrate holding and rotating mechanism for holding and rotating the substrate Wf and either of the cleaning member holding mechanism 102 and the sponge member 101. When the cleaning member holding mechanism 102 and the sponge member 101 are moved in this way, a contact surface of the sponge member 101 that comes in contact with the substrate Wf is unable to sufficiently cover the edge portion Wfa. Consequently, the range of cleaning does not extend to the edge portion Wfa. In other words, the radius R1 of the cleaning range of the cleaning device is small, and the edge portion E1 of the substrate Wf left uncleaned is undesirably large in area.

③ The corner of the substrate contacting surface of the sponge member 101 is rounded. Accordingly, the area (outer diameter) of contact of the sponge member 101 with the substrate Wf readily changes with variations in pressure with which the sponge member 101 is pressed against the substrate Wf. Thus, variations in pressure applied to the sponge member 101 cause the cleaning range to change undesirably.

Figure 2:
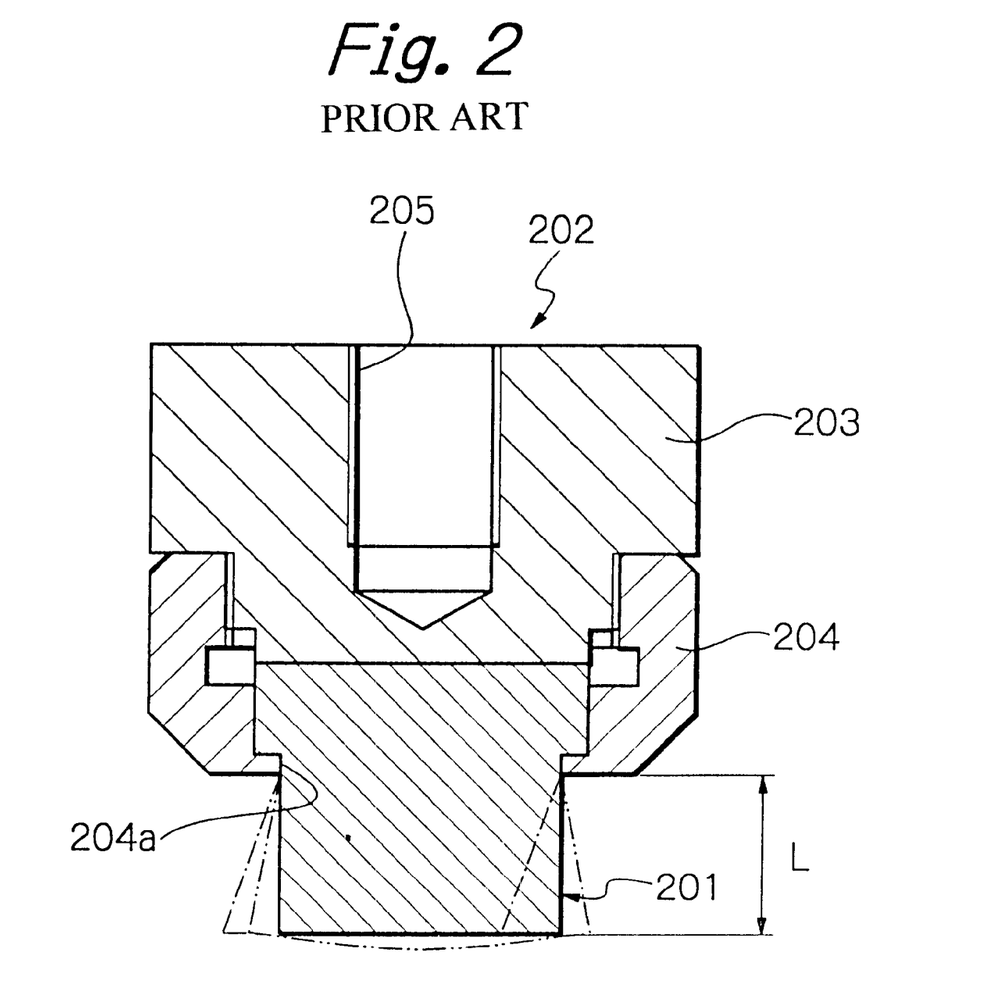
FIG. 2 is a sectional view showing another structural example of the conventional cleaning devices.

FIG. 2 shows the structure of another conventional cleaning device of the type described above. As shown in FIG. 2, the cleaning device includes a stepped columnar sponge member 201 having an upper portion with a larger outer diameter than that of a lower portion thereof. The cleaning device further includes a cleaning member holding mechanism 202 for holding the sponge member 201. The cleaning member holding mechanism 202 includes a stepped columnar holder body 203 having an upper portion with a larger outer diameter than that of a lower portion thereof. The cleaning member holding mechanism 202 further includes a ring member 204 that is brought into threaded engagement with the outer periphery of the lower portion of the holder body 203. The ring member 204 has a projection 204a projecting inward from the distal end thereof.

With the sponge member 201 placed in abutment against the holder body 203, the ring member 204 is brought into threaded engagement with the outer periphery of the lower portion of the holder body 203. Consequently, the projection 204a of the ring member 204 abuts against the step portion of the sponge member 201, and thus the upper portion of the sponge member 201 is held between the projection 204a and the holder body 203. In this way, the sponge member 201 is fitted in the cleaning member holding mechanism 202. The holder body 203 is formed with a tapped hole 205 for threaded engagement with the distal end of a rotating shaft for holding and rotating the cleaning device. The cleaning device having the above-described structure involves some problems as stated below.

① Because the ring member 204 is connected to the holder body 203 by threaded engagement, it takes a great deal of time and labor to loosen or tighten the ring member 204 when the sponge member 201 is to be detached or attached.

② In use, a sponge swells with cleaning water or the like and slightly increases in volume. In this regard, the sponge member 201 is held by the holder body 203 and the ring member 204 in the cleaning device having the structure shown in FIG. 2. Therefore, expansion occurs markedly at the substrate contacting surface of the sponge member 201, and the sponge member 201 tends to swell convexly at the center of the substrate contacting surface (as shown by the chain double-dashed line in FIG. 2). This may cause damage to the surface of a film formed on the surface of the substrate to be cleaned, depending on the kind of film.

③ Unlike the cleaning member shown in FIG. 1, the sponge member 201 of the cleaning device shown in FIG. 2 is shaped such that the outer peripheral portion thereof forms right angles to the lower surface thereof (i.e. the corner is not rounded). Therefore, the area of contact of the sponge member 201 with the substrate to be cleaned seems to be wide. However, in the case of the cleaning device shown in FIG. 2, the amount L that the sponge member 201 projects from the lower end of the ring member 204 needs to be large in order to avoid interference between the cleaning member holding mechanism 202 and a chuck (not shown). Accordingly, when moved toward the outer periphery of the substrate, the sponge member 201 is deformed toward the center of the substrate as shown by the one-dot chain line in FIG. 2. In actuality, the outer diameter of contact of the sponge member 201 becomes small at the outer peripheral portion of the substrate. Therefore, the outer peripheral portion of the substrate is likely to be left uncleaned. Moreover, the deformation of the sponge member 201 causes variations (reduction) in the contact pressure of the sponge member 201 with respect to the substrate.

SUMMARY OF THE INVENTION

In view of the above-described circumstances, an object of the present invention is to provide a cleaning device designed so that a cleaning member, e.g. a sponge, which comes into contact with a substrate to be cleaned, is easy to fit to the cleaning device, and even when the cleaning member is deformed, the substrate can be cleaned right up to the edge, and further that the area of contact with the substrate is unlikely to change with variations in pressure with which the cleaning member is pressed against the substrate, and thus no damage is caused to the surface of a film formed on the substrate.

Another object of the present invention is to provide a substrate cleaning apparatus using the above-described cleaning device.

The present invention provides a cleaning device for use in a substrate cleaning apparatus. The cleaning device includes a cleaning member to be brought into contact with a surface of a substrate to be cleaned, and a cleaning member holding mechanism for holding the cleaning member. The cleaning member holding mechanism includes a holding member having a lower portion split into a plurality of chuck jaws or members, and a ring member fitted onto the outer periphery of the holding member. An end portion of the cleaning member is inserted into an insertion hole formed by the plurality of chuck jaws of the holding member, and the ring member is fitted onto the outer periphery of the holding member, thereby holding the cleaning member with the chuck jaws. Thus, the feature of the present invention resides in the cleaning member holding mechanism having a collet chuck structure.

By using a collet chuck structure to fit the cleaning member to the cleaning member holding mechanism, the cleaning member can be fitted to the cleaning member holding mechanism simply by inserting the end portion of the cleaning member into the insertion hole formed by the chuck jaws of the holding member and then fitting the ring member onto the outer periphery of the holding member.

Preferably, the corner of a portion of the cleaning member that comes in contact with the substrate is angled as viewed in a vertical section.

By virtue of the above-described arrangement, it becomes possible to include the edge portion of the substrate to be cleaned in the range of cleaning. In addition, because the corner of the contact portion is angled, but not rounded, the cleaning range does not change with variations in pressure applied to the cleaning member.

Preferably, the cleaning member has a stepped configuration as viewed in a vertical section in which a portion closer to the surface that comes in contact with the substrate to be cleaned is wider than a portion thereof that is inserted into the holding member, and the distal ends of the plurality of chuck jaws of the holding member are pressed against the step portion of the cleaning member.

By virtue of the above-described arrangement, even when the cleaning member is moved to the edge portion of the substrate being cleaned, a projection of a substrate holding and rotating mechanism that holds the substrate does not interfere with the outer periphery of the cleaning member holding mechanism, which holds the cleaning member. Accordingly, it becomes possible to include the edge portion of the substrate in the range of cleaning. In addition, because the distal ends of the chuck jaws are pressed against the step portion of the cleaning member, the cleaning member is held by the distal ends of the chuck jaws so that the substrate contacting surface of the cleaning member is prevented from being pushed up away from the substrate. Consequently, the pressure with which the contact surface of the cleaning member is pressed against the substrate becomes low in the center of the contact surface. Accordingly, the cleaning member does not cause damage to the surface of a film formed on the surface of the substrate.

Preferably, projections are provided on the surfaces of the chuck jaws of the holding member that come in contact with the cleaning member and/or a surface of the holding member contacted by the end surface of the portion of the cleaning member inserted into the insertion hole.

By virtue of the presence of the projections, the rotational force of the cleaning member holding mechanism can be satisfactorily transmitted to the cleaning member, so that even when the cleaning member is pressed against the substrate to be cleaned, the cleaning member holding mechanism can surely rotate the cleaning member without racing.

In addition, the present invention provides a cleaning device for cleaning a substrate by coming into contact with it. The cleaning device includes a cleaning member and a cleaning member holding mechanism for holding the cleaning member. The cleaning member has a stepped configuration in which the outer diameter of a portion closer to a surface of the cleaning member that comes into contact with the substrate is larger than the outer diameter of a portion of the cleaning member closer to the cleaning member holding mechanism, and a vertical section of the cleaning member taken along a line passing through the center thereof has an inverted T-shaped configuration.

By virtue of the above-described stepped configuration of the cleaning member, it becomes possible to include the edge portion of the substrate in the range of cleaning.

In any of the above-described cleaning devices, the cleaning member may be made of a porous material. Alternatively, the cleaning member may be a combination of a cloth holding member and a cloth bonded thereto.

In addition, the present invention provides a substrate cleaning apparatus including a substrate holding and rotating mechanism and a cleaning device, wherein a cleaning fluid is supplied onto a surface of a substrate to be cleaned that is being rotated in a horizontal position by the substrate holding and rotating mechanism, and the cleaning device is brought into contact with the surface of the substrate being rotated, thereby cleaning the surface of the substrate. One of the above-described cleaning devices is used as the cleaning device of the substrate cleaning apparatus.

The use of one of the above-described cleaning devices makes it possible to realize a substrate cleaning apparatus that exhibits the above-described advantageous effects of the cleaning device.

The above and other objects, features and advantages of the present invention will become more apparent from the following description of the preferred embodiments thereof, taken in conjunction with the accompanying drawings.

BRIEF DESCRIPTION OF THE DRAWINGS

FIGS. 5(a) and 5(b) show an operational comparison between a conventional cleaning device and the cleaning device according to the present invention, in which

FIGS. 6(a) and 6(b) show another structural example of the cleaning device according to the present invention, in which

FIGS. 7(a) and 7(b) show another structural example of the cleaning device according to the present invention, in which

FIGS. 8(a) and 8(b) show another structural example of the cleaning device according to the present invention, in which

FIGS. 9(a) and 9(b) show another structural example of the cleaning device according to the present invention, in which

DETAILED DESCRIPTION OF THE PREFERRED EMBODIMENTS

Figure 3:
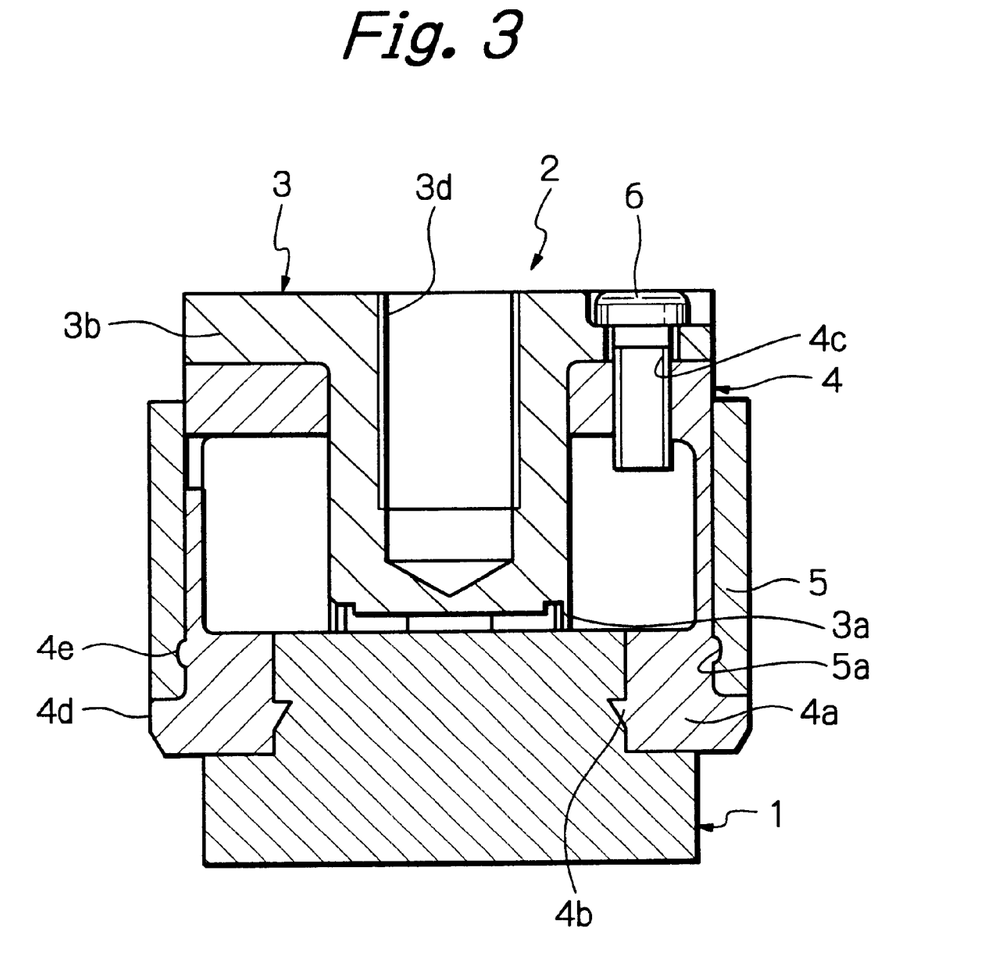
FIG. 3 is a sectional view showing a structural example of the cleaning device according to the present invention.
Figure 4:
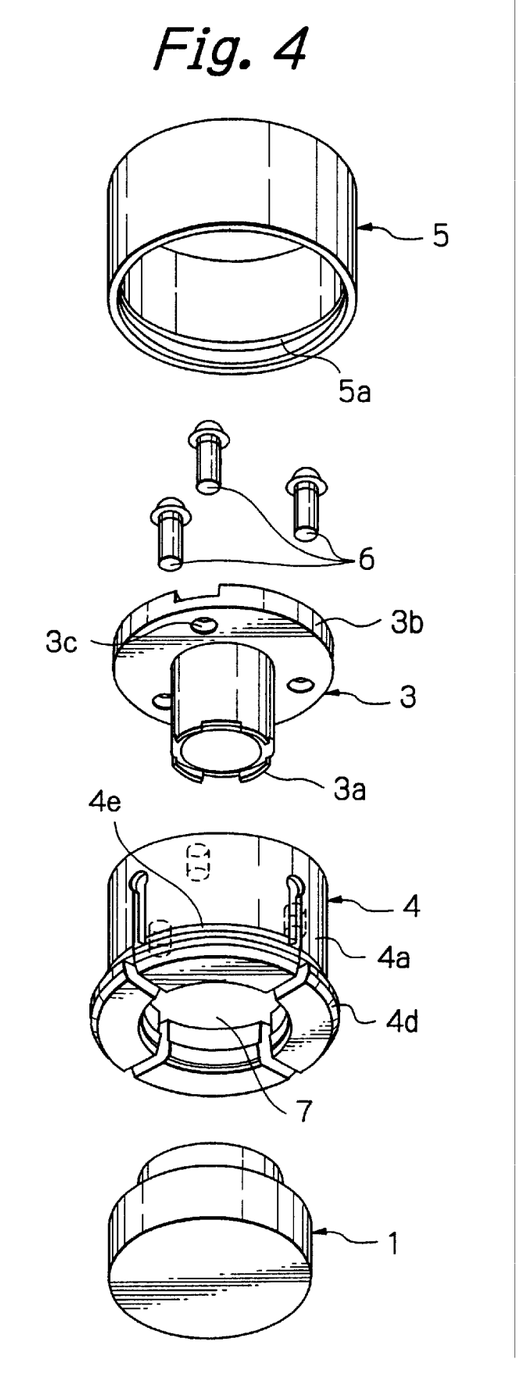
FIG. 4 is an exploded perspective view showing the structural example of the cleaning device according to the present invention.

Embodiments of the present invention will be described below with reference to the accompanying drawings. FIGS. 3 and 4 show a structural example of the cleaning device according to the present invention. FIG. 3 is a sectional view, and FIG. 4 is an exploded perspective view. As shown in the figures, the cleaning device has a cleaning member 1 that comes into direct contact with a substrate to be cleaned, and a cleaning member holding mechanism 2 for holding the cleaning member 1. The cleaning member holding mechanism 2 has a holder core 3, a sleeve 4, and a ring member 5.

The holder core 3 is columnar and has four projections or protrusions 3a formed on the outer peripheral portion of the lower end surface. The holder core 3 has a collar 3b formed on the upper end thereof. The collar 3b has a larger outer diameter than that of the rest of the holder core 3. The collar 3b is formed with through-holes 3c for receiving screws 6. The center of the holder core 3 is formed with a tapped hole 3d for threaded engagement with the distal end of a rotating shaft for holding and rotating the cleaning device.

The sleeve 4 is in the shape of a cylinder in which the upper and lower end portions are thick walled and the central portion is thin walled. The sleeve 4 has four slits provided therein so that the lower portion of the sleeve 4 is split into four chuck jaws or members 4a. The four chuck jaws 4a are spaced circumferentially to form an insertion hole or opening 7 by their respective inner peripheral surfaces. The insertion hole 7 receives the upper portion of the cleaning member 1. A projection 4b is provided on the inner peripheral surface of each chuck jaw 4a. The upper end portion of the sleeve 4 is formed with tapped holes 4c in which the screws 6 are screwed. A projecting portion 4d is formed on the outer peripheral surface of the distal end of each chuck jaw 4a. A projection 4e is formed on the outer peripheral surface of each chuck jaw 4a above the projecting portion 4d. The projection 4e is fitted into a groove 5a formed on the inner peripheral surface of the ring member 5.

The ring member 5 is a cylindrical member whose inner diameter is approximately the same as the outer diameter of the sleeve 4. The inner peripheral surface of the ring member 5 is formed with a groove 5a for engagement with the projection 4e formed on the outer periphery of each chuck jaw 4a of the sleeve 4.

The cleaning member 1 is in the shape of a stepped cylinder having a vertical sectional configuration in which a portion closer to the lower end, i.e. the surface that comes in contact with a substrate to be cleaned, is wider than a portion thereof closer to the upper end that is inserted into the insertion hole 7 formed by the inner peripheral surfaces of the chuck jaws 4a of the sleeve 4. The corner at the lower end of the cleaning member 1 is angled (at 90 degrees) as viewed in a vertical section.

When assembling a cleaning device having the cleaning member 1 and the cleaning member holding mechanism 2, the holder core 3 is inserted into the hole in the center of the sleeve 4 until the lower end surface of the collar 3b abuts against the upper end surface of the sleeve 4. Then, the screws 6 are passed through the through-holes 3c of the holder core 3 and screwed in the tapped holes 4c of the sleeve 4, thereby securing together the holder core 3 and the sleeve 4. The assembly of the holder core 3 and the sleeve 4 constitutes a holding member for holding firmly the cleaning member 1.

Next, the upper portion of the cleaning member 1 is inserted into the insertion hole 7 formed by the inner peripheral surfaces of the four chuck jaws 4a of the sleeve 4 until the step surface of the cleaning member 1 abuts against the distal end surfaces of the chuck jaws 4a. Subsequently, the ring member 5 is fitted onto the outer periphery of the sleeve 4 from the upper end of the holding member until the distal end of the ring member 5 abuts against the projecting portions 4d at the distal ends of the chuck jaws 4a.

As stated above, after the upper portion of the cleaning member 1 has been inserted into the sleeve 4, the ring member 5 is fitted onto the outer periphery of the sleeve 4. Consequently, the chuck jaws 4a expanded radially outwardly by the insertion of the cleaning member 1 are pressed radially inwardly, causing the projections 4b, which are provided on the inner peripheral surfaces of the chuck jaws 4a, to bite into the outer periphery of the cleaning member 1. Thus, the cleaning member 1 is secured to the chuck jaws 4a with a sufficiently strong securing force. At this time, the four projections or protrusions 3a, which are provided on the lower end surface of the holder core 3, also bite into the upper end surface of the cleaning member 1, thereby intensifying the force for securing the cleaning member 1. Further, at this time, the groove 5a provided on the inner peripheral surface of the ring member 5 is fitted with the projections 4e formed on the outer peripheries of the chuck jaws 4a. Thus, the ring member 5 is fixed to the sleeve 4.

To remove the cleaning member 1 from the cleaning member holding mechanism 2, the ring member 5 is pushed up to allow the chuck jaws 4a to flex outwardly. Consequently, the cleaning member 1 can be readily removed from the cleaning member holding mechanism 2 by pulling the cleaning member 1 downwardly. To attach a new cleaning member 1 to the cleaning member holding mechanism 2, the cleaning member 1 is inserted into the insertion hole 7 formed by the inner peripheral surfaces of the chuck jaws 4a, and then the ring member 5 is pushed down. Thus, the cleaning member 1 can be detached from the cleaning member holding mechanism 2 simply by pushing up the ring member 5 and then removing the cleaning member 1. The cleaning member 1 can also be attached to the cleaning member holding mechanism 2 simply by inserting the cleaning member 1 and then pushing down the ring member 5. Therefore, the cleaning member detaching and attaching operations are extremely easy.

Figure 5B:
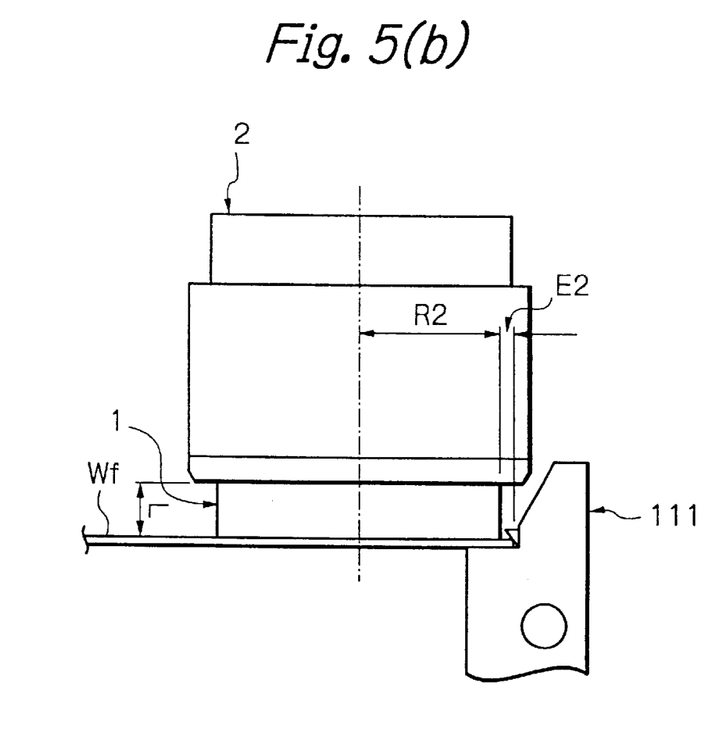
FIG. 5(b) shows an example of the cleaning device according to the present invention.

As viewed in a vertical section of the cleaning member 1, the corner of a portion of the cleaning member 1 that comes in contact with a substrate to be cleaned is angled (at 90 degrees), but not rounded as in the prior art [see FIG. 5(a)]. In addition, the step portion of the cleaning member 1 is held by the distal ends of the chuck jaws 4a. Moreover, the amount L that the cleaning member 1 projects from the cleaning member holding mechanism 2 can be reduced. Therefore, the cleaning member 1 is unlikely to be deformed. Accordingly, even when the pressure with which the cleaning member 1 is pressed against the substrate Wf to be cleaned is changed, as shown in FIG. 5(b), there is substantially no change in the area of contact of the cleaning member 1 with the substrate Wf. Consequently, there is substantially no change in the range of cleaning.

It should be noted that there may be variations in the amount of deformation of the cleaning member 1 because friction between the cleaning member 1 and the substrate Wf changes according to the kind of film or the like formed on the surface of the substrate Wf, and the amount of deformation of the cleaning member 1 may also vary according to the set pressure. In such a case, the amount of projection of the cleaning member 1 and the outer diameter thereof should be set optimally according to the amount of deformation of the cleaning member 1 so that the cleaning range becomes as wide as possible.

In addition, the cleaning member 1 is in the shape of a stepped cylinder having a vertical sectional configuration in which a portion closer to the surface that comes in contact with a substrate to be cleaned is wider than a portion thereof that is inserted into the sleeve 4. Therefore, even when the cleaning member 1 is moved to a position close to a projection (chuck) 111 of a substrate holding and rotating mechanism that holds the substrate Wf, the outer periphery of the cleaning member holding mechanism 2 does not interfere with the projection 111. That is, as shown in FIG. 5(b), the radius R2 of the cleaning range of the cleaning device is large, and the edge portion E2 of the substrate Wf that is left uncleaned is small. In comparison between the prior art shown in FIG. 5(a) and the example of the present invention shown in FIG. 5(b), there are the following relationships:. R2>R1 and E1>E2.

In addition, the cleaning device has a structure in which the distal ends of the plurality of chuck jaws 4a of the sleeve 4 are pressed against the step portion of the cleaning member 1. Therefore, even when a force acts on the substrate contacting surface of the cleaning member 1 so as to push up the substrate contacting surface away from the substrate, the cleaning member 1 is held by the distal ends of the chuck jaws 4a. Accordingly, the substrate contacting surface is prevented from becoming convex, and the pressure with which the contact surface of the cleaning member 1 is pressed against the substrate becomes low in the center of the contact surface. Therefore, the cleaning member 1 does not cause damage to the surface of a film formed on the surface of the substrate.

In addition, the projections 4b are formed on the inner peripheral surfaces of the plurality of chuck jaws 4a of the sleeve 4, and the projections 3a are formed on the lower end surface of the holder core 3. Therefore, rotational force of the cleaning member holding mechanism 2 can be satisfactorily transmitted to the cleaning member 1. Even when the cleaning member 1 is pressed against a substrate to be cleaned, the cleaning member holding mechanism 2 can surely rotate the cleaning member 1 without racing.

In addition, when fitting the cleaning member 1 into the cleaning member holding mechanism 2, as the cleaning member 1 is inserted into the insertion hole 7 formed by the inner peripheral surfaces of the chuck jaws 4a of the sleeve 4, the projections 4b on the inner peripheral surfaces of the chuck jaws 4a are pushed outwardly, and thus the chuck jaws 4a are pushed outwardly. However, pushing down the ring member 5 causes the chuck jaws 4a to be pushed inwardly. Consequently, the inner peripheral surfaces of the chuck jaws 4a come into close contact with the outer peripheral surface of the cleaning member 1. Moreover, the projections 4b bite into the outer peripheral surface of the cleaning member 1. Thus, the cleaning member 1 is held reliably.

Figure 6A:
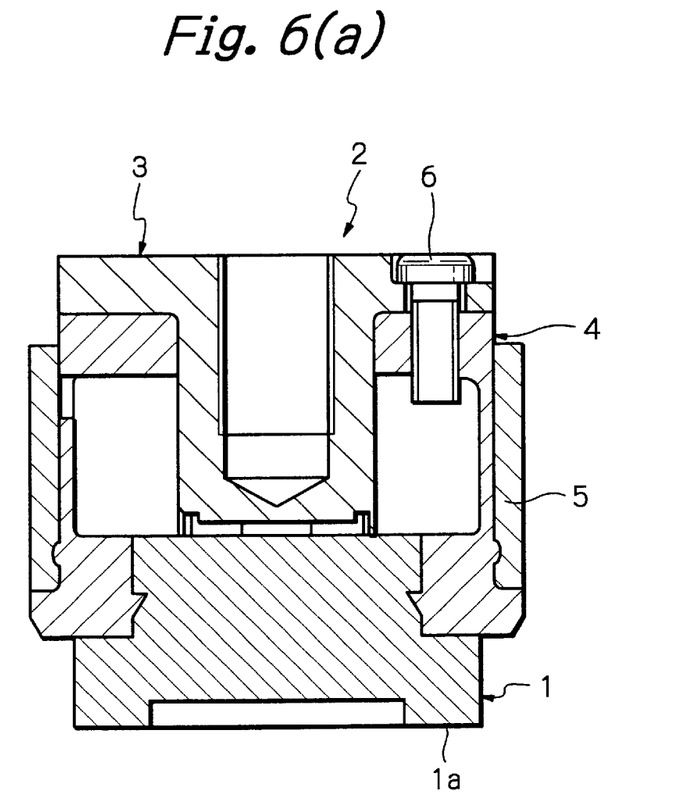
FIG. 6(a) is a sectional view.
Figure 6B:
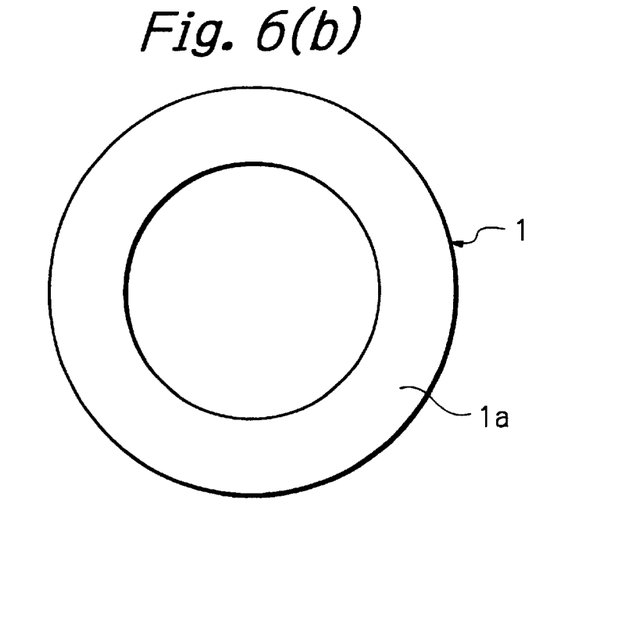
FIG. 6(b) is a bottom view of a cleaning member.

FIGS. 6(a) and 6(b) show another structural example of the cleaning device according to the present invention. FIG. 6(a) is a sectional view of the cleaning device, and FIG. 6(b) is a bottom view of a cleaning member of the cleaning device. In this cleaning device, the structure of a cleaning member holding mechanism 2 is the same as that of the cleaning member holding mechanism of the cleaning device shown in FIGS. 3 and 4; The cleaning device shown in FIGS. 6(a) and 6(b) differs from the cleaning device shown in FIGS. 3 and 4 in that a flat annular projection 1a is provided on the lower surface of the outer peripheral portion of the lower end surface of the cleaning member 1. By virtue of the above-described configuration of the cleaning member 1, the substrate is cleaned with the contact surface of the annular projection 1a under uniform contact pressure because the distal ends of the chuck jaws 4a abut against the step surface of the cleaning member 1.

Figure 7A:
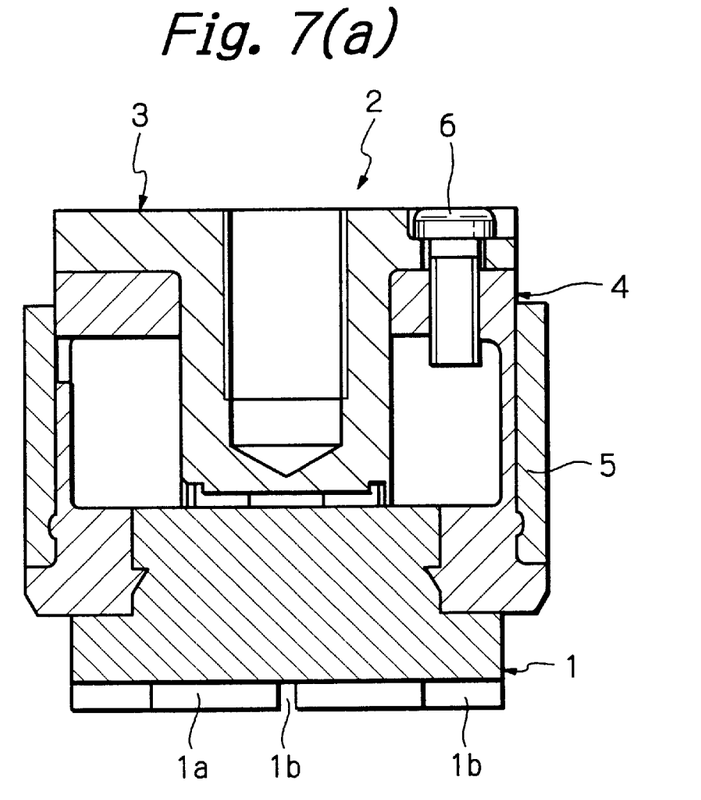
FIG. 7(a) is a sectional view.
Figure 7B:
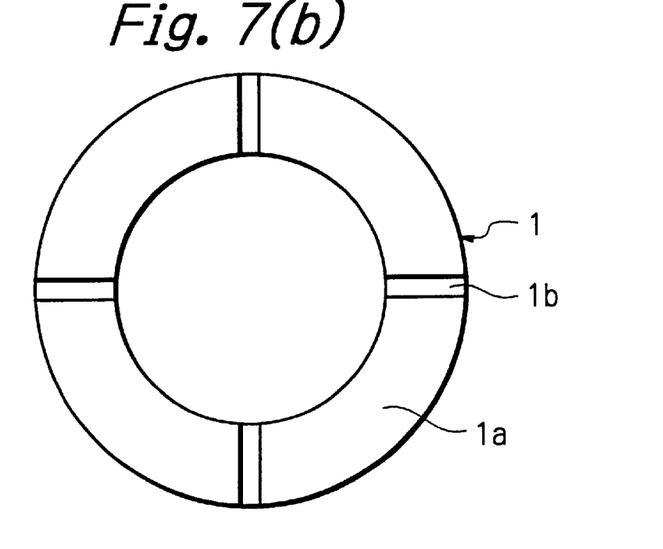
FIG. 7(b) is a bottom view of a cleaning member.

FIGS. 7(a) and 7(b) show another structural example of the cleaning device according to the present invention. FIG. 7(a) is a sectional view of the cleaning device, and FIG. 7(b) is a bottom view of a cleaning member of the cleaning device. In this cleaning device, the structure of a cleaning member holding mechanism 2 is the same as that of the cleaning member holding mechanism of the cleaning device shown in FIGS. 3 and 4. The cleaning device shown in FIGS. 7(a) and 7(b) differs from the cleaning device shown in FIGS. 6(a) and 6(b) in that a plurality of slits 1b are provided radially in the annular projection 1a provided on the outer peripheral portion of the lower end surface of the cleaning member 1, thereby splitting the annular projection 1a into a plurality of portions (four portions in the illustrated example). By virtue of the presence of the slits 1b, a cleaning fluid supplied onto a substrate to be cleaned flows through the slits 1b. Thus, the cleaning effect improves.

Figure 8A:
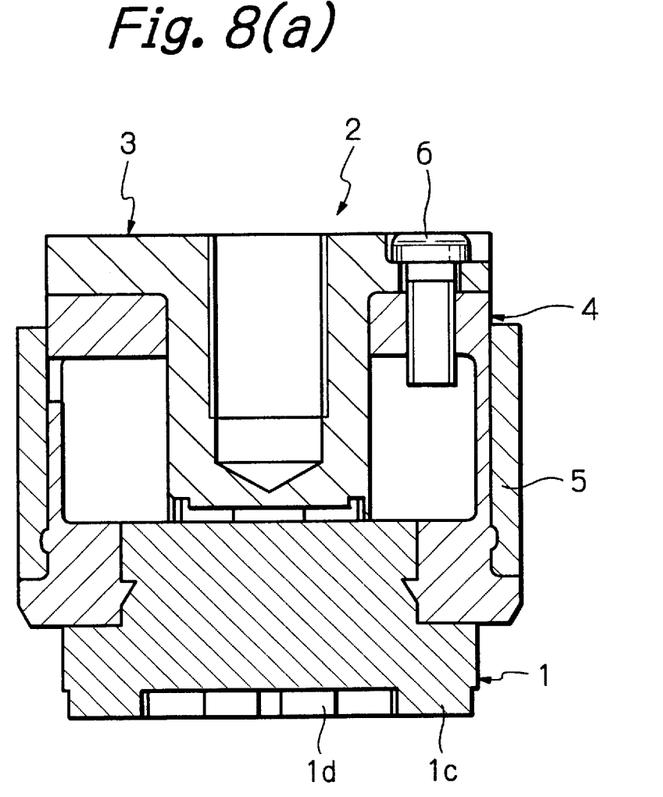
FIG. 8(a) is a sectional view.
Figure 8B:
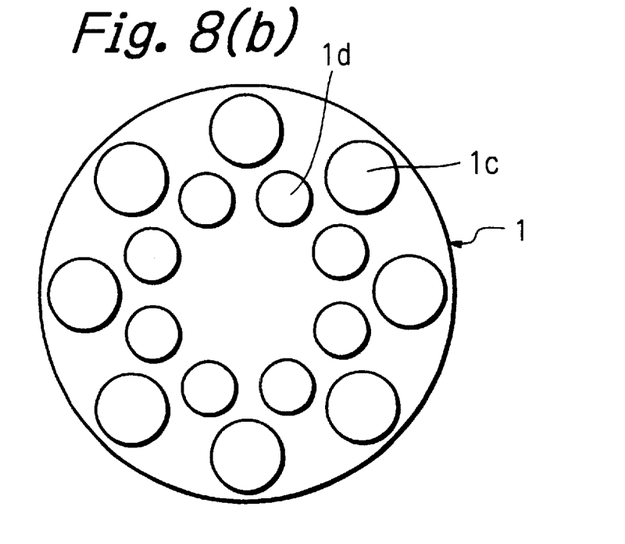
FIG. 8(b) is a bottom view of a cleaning member.

FIGS. 8(a) and 8(b)show another structural example of the cleaning device according to the present invention. FIG. 8(a) is a sectional view of the cleaning device, and FIG. 8(b) is a bottom view of a cleaning member of the cleaning device. In this cleaning device, the structure of a cleaning member holding mechanism 2 is the same as that of the cleaning member holding mechanism of the cleaning device shown in FIGS. 3 and 4. The cleaning device shown in FIG. 8 differs from those shown in FIGS. 6(a) and 6(b) and 7(a) and 7(b) in that a plurality of disk-shaped projections 1c and 1*d* are concentrically provided on the lower end surface of the cleaning member 1 at equal intervals, respectively. In the example shown in FIGS. 8(*a*) and 8(*b*), the disk-shaped projections 1*c* have a larger diameter than that of the disk-shaped projections 1*d*. The disk-shaped projections 1*c* are circumferentially disposed at equal intervals along the outer peripheral portion of the lower end surface of the cleaning member 1. The disk-shaped projections 1*d* are circumferentially disposed at equal intervals inside the disk-shaped projections 1*c*. By virtue of the above-described arrangement, a cleaning fluid flows between the disk-shaped projections 1*c* and 1*d*. Accordingly, the cleaning effect is improved.

In the cleaning devices shown in FIGS. 3 to 8(*b*), there is no particular limitation on materials used to form the holder core 3, the sleeve 4 and the ring member 5, which constitute the cleaning member holding mechanism 2. For example, plastic materials are usable. Examples of usable plastic materials are PVC (polyvinyl chloride), PE (polyethylene), PP (polypropylene), PET (polyethylene terephthalate), PVDF (polyvinylidene fluoride), PEEK (polyether ether ketone), and PTFE (polytetrafluoroethylene).

Materials used to form the cleaning member 1 are not particularly limited. Any porous material having liquid absorption properties is usable. For example, PVA (polyvinyl alcohol) sponge [=porous PVF (polyvinyl formal)] may be used.

Figure 9A:
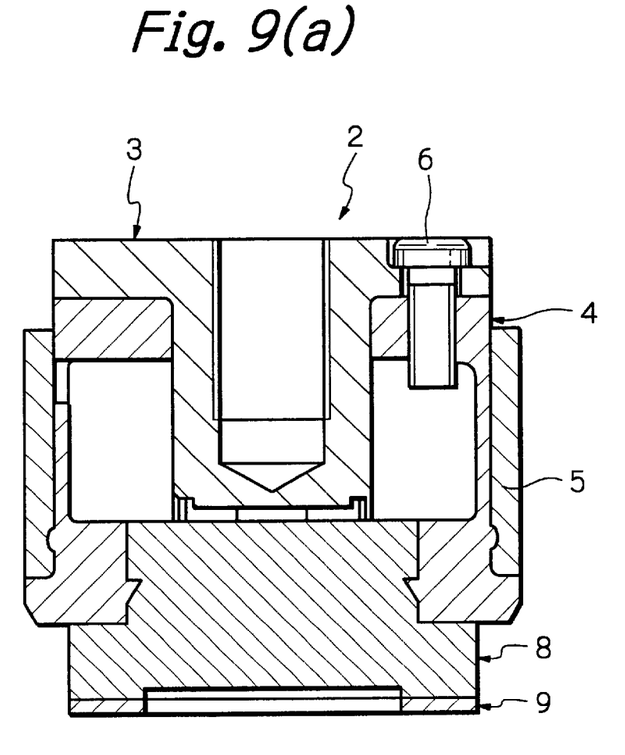
FIG. 9(a) is a sectional view.
Figure 9B:
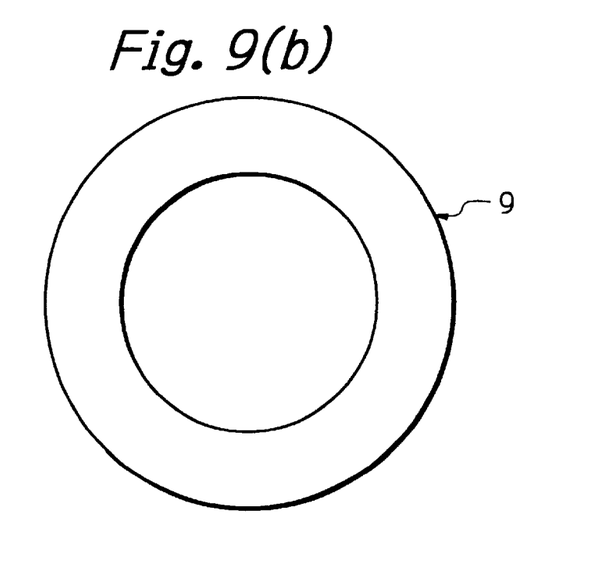
FIG. 9(b) is a bottom view of a cleaning member.

Although in the above-described examples the cleaning member 1 made of a porous material, e.g. a sponge, is fitted into the cleaning member holding mechanism 2, the cleaning member 1 is not necessarily limited to a porous material. As shown in FIGS. 9(*a*) and 9(*b*), a cloth holding member 8 having an annular cloth 9 bonded to a lower surface thereof may be fitted into the cleaning member holding mechanism 2. In this case, the cloth holding member 8 is formed in a shape approximately the same as that of the cleaning member 1 of the cleaning device shown in FIGS. 6(*a*) and 6(*b*).

The cloth holding member 8 can be formed by using the same plastic materials as those usable for the holder core 3, the sleeve 4 and the ring member 5. It is also possible to use FKM (fluororubber), EPDM (ethylene propylene rubber), urethane rubber, etc. Regarding the material of the cloth 9, it is possible to use any cloth having pores in the surface thereof so that foreign substances, e.g. dust, removed from the surface of a substrate being cleaned by friction between the cloth 9 and the substrate are received in the pores, such as urethane foam, a nonwoven fabric consisting of fibers fixed with a urethane resin, or a suede type abrasive cloth.

The cleaning device using the cloth 9 as stated above preferably has a structure in which a cloth holding member 8 of a non-rigid material (e.g. a rubber) has a cloth 9 bonded thereto which is more rigid than the cloth holding member 8. However, the structure of the cleaning device is not necessarily limited to the above. The structure may be such that a cloth holding member 8 and a cloth 9 are integrally formed, or a cloth 9 is bonded to a cloth holding member 8 made of an inelastic plastic material.

Figure 10:
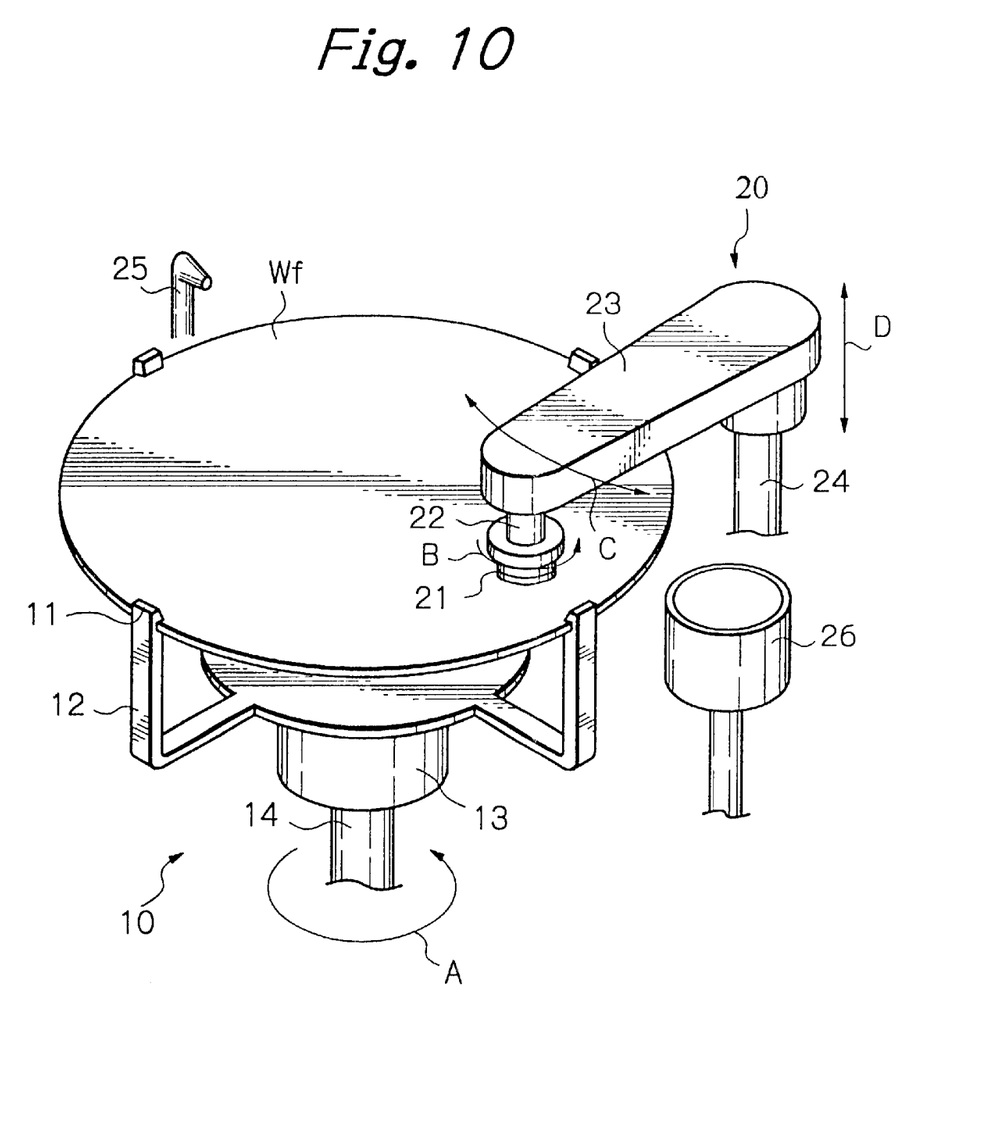
FIG. 10 is a view showing the arrangement of a substrate cleaning apparatus using the cleaning device according to the present invention.

FIG. 10 is a diagram schematically showing the arrangement of a substrate cleaning apparatus using the above-described cleaning device according to the present invention. As illustrated in the figure, the substrate cleaning apparatus has a substrate holding and rotating mechanism 10 for holding and rotating a substrate Wf to be cleaned, and a cleaning device fitting mechanism 20 fitted with a cleaning device 21. The substrate holding and rotating mechanism 10 has a plurality of arms 12 (four arms in the illustrated example) fitted with chucks 11 for holding the substrate Wf in a horizontal position. The arms 12 are integrally mounted on a base 13 and adapted to be rotatable in the direction of the arrow A by a rotating shaft 14.

The cleaning device fitting mechanism 20 has an oscillating arm 23. A rotating shaft 22 is provided on the distal end of the oscillating arm 23. The cleaning device 21 according to the present invention is fitted to the distal end of the rotating shaft 22. The rotating shaft 22 is rotated in the direction of the arrow B by a rotating mechanism (not shown), causing the cleaning device 21 to rotate in the same direction. An oscillating shaft 24 is provided on the rear (proximal) end of the oscillating arm 23 to cause the oscillating arm 23 to oscillate in the direction of the arrow C. The oscillating shaft 24 also causes the oscillating arm 23 to move up and down as shown by the arrow D.

In the substrate cleaning apparatus arranged as stated above, a cleaning fluid, e.g. pure water, is sprayed from a nozzle 25 onto the upper surface of the substrate Wf being rotated in the direction of the arrow A while being held in a horizontal position by the substrate holding and rotating mechanism 10. At the same time, the cleaning device 21 is rotated in the direction of the arrow B by the cleaning device fitting mechanism 20, and the oscillating arm 23 is oscillated in the direction of the arrow C so that the cleaning device 21 passes through the center of rotation of the substrate Wf, thereby cleaning the upper surface of the substrate Wf. Upon completion of cleaning, the oscillating arm 23 is turned to dip the cleaning device 21 in a cleaning fluid contained in a container 26. The cleaned substrate Wf is rotated at high speed so as to be spin-dried by the substrate holding and rotating mechanism 10. Thereafter, the substrate Wf is transferred to the subsequent processing step by a robot arm (not shown).

Thus, the present invention provides various advantageous effects as stated below.

According to the present invention, a collet chuck structure is used to fit the cleaning member to the cleaning member holding mechanism. Thus, the cleaning member can be fitted to the cleaning member holding mechanism simply by inserting an end portion of the cleaning member into the insertion hole formed by the plurality of chuck jaws of the holding member (sleeve) and then fitting the ring member onto the outer periphery of the sleeve.

According to one aspect of the present invention, the corner of a portion of the cleaning member that comes into contact with a substrate to be cleaned is angled as viewed in a vertical section. Therefore, it becomes possible to include the edge portion of the substrate in the range of cleaning. Thus, even the edge portion can be satisfactorily cleaned.

According to another aspect of the present invention, projections are provided on the surfaces of chuck jaws of the holding member that come in contact with the cleaning member and/or a surface of the holding member contacted by the end surface of the portion of the cleaning member inserted into the insertion hole. Therefore, the rotational force of the cleaning member holding mechanism can be satisfactorily transmitted to the cleaning member, so that even when the cleaning member is pressed against the substrate to be cleaned, the cleaning member holding mechanism can surely rotate the cleaning member without racing.

According to another aspect of the present invention, the cleaning member has a stepped configuration in which the outer diameter of a portion closer to the surface that comes in contact with the substrate to be cleaned is larger than the outer diameter of a portion of the cleaning member closer to the cleaning member holding mechanism, and a vertical section of the cleaning member taken along a line passing through the center thereof has an inverted T-shaped configuration. Therefore, it becomes possible to include the edge portion of the substrate in the range of cleaning.

According to another aspect of the present invention, one of the above-described cleaning devices is used as a cleaning device of a substrate cleaning apparatus. Therefore, it is possible to realize a substrate cleaning apparatus that exhibits the above-described advantageous effects of the cleaning device.

It should be noted that the present invention is not necessarily limited to the foregoing embodiments but can be modified in a variety of ways without departing from the gist of the present invention.

What is claimed is:

1. A cleaning device for cleaning an article, comprising:
   a stepped cylindrical cleaning member including a large diameter cylindrical portion having a cleaning surface at its distal end to be engaged with an article to clean the article and also having an annular step surface at its proximal end, and a small diameter cylindrical portion connected to said annular step surface; and
   a cleaning member holding mechanism for holding said cleaning member, wherein said cleaning member holding mechanism includes
   (i) a cleaning member holder having chuck members that have end surfaces to be engaged with said annular step surface, said chuck members defining an opening to receive said small diameter cylindrical portion, with said chuck members being radially movable relative to one another, and
   (ii) a fastener adapted to be fitted around said chuck members for radially inwardly pressing said chuck members such that said chuck members securely hold said small diameter portion when said small diameter portion is received within said opening.

2. The cleaning device according to claim 1, wherein said large diameter cylindrical portion includes a peripheral annular projection having an annular flat surface that defines said cleaning surface.

3. The cleaning device according to claim 2, wherein said large diameter cylindrical portion further includes at least one recess that radially extends from an inner annular edge of said annular flat surface to an outer annular edge of said annular flat surface.

4. The cleaning device according to claim 1, wherein said large diameter cylindrical portion includes a first set of projections circumferentially arranged at equal intervals along an outer peripheral portion of said large diameter cylindrical portion, with said projections having flat surfaces that define at least a portion of said cleaning surface.

5. The cleaning device according to claim 4, wherein said large diameter cylindrical portion further includes a second set of projections that are positioned inside of and coaxially with said first set of projections, with said projections of said second set being spaced at equal intervals and having flat surfaces that together with said flat surfaces of said projections of said first set define said cleaning surface.

6. The cleaning device according to claim 1, wherein said large diameter cylindrical portion includes a peripheral annular projection and a thin annular member attached to said peripheral annular projection, with said thin annular member having an annular surface that defines said cleaning surface.

7. The cleaning device according to claim 1, wherein said cleaning member holder comprises a cylindrical member having said opening, said chuck members are defined by slits extending axially through said cylindrical member from a distal end of said cylindrical member, with respective said chuck members existing between respective adjacent ones of said slits, and said fastener comprises an annular member adapted to be fitted around said cylindrical member to radially inwardly press said chuck members.

8. The cleaning device according to claim 1, wherein said cleaning member includes a side surface that intersects with said cleaning surface at an angle.

9. The cleaning device according to claim 1, wherein said chuck members include projections to be pressed into said small diameter cylindrical portion when said small diameter cylindrical portion is received within said opening.

10. The cleaning device according to claim 1, wherein said small diameter cylindrical portion includes an end surface to be positioned within said opening when said small diameter cylindrical portion is received within said opening, and said cleaning member holder further includes a protrusion to be pressed into said end surface.

11. A cleaning member holding mechanism for use in a cleaning device that is to clean an article with a cleaning member, comprising:
   a cleaning member holder including a cylindrical member having an opening to receive a cleaning member and also having slits extending axially through said cylindrical member from a distal end of said cylindrical member such that respective chuck members are defined between respective adjacent ones of said slits and define said opening, with said respective chuck members being radially movable relative to one another, said cleaning member holder also including a protrusion to be pressed into an end surface of the cleaning member when the end surface is positioned within said opening; and
   a fastener including an annular member adapted to be fitted around said cylindrical member to radially inwardly press said respective chuck members such that said respective chuck members securely hold the cleaning member when the cleaning member is received within said opening.

12. The cleaning device according to claim 11, wherein said chuck members include projections to be pressed into the cleaning member when the cleaning member is received within said opening.

13. A cleaning member holding mechanism for use in a cleaning device that is to clean an article with a cleaning member, comprising:
   a cleaning member holder having chuck members that define an opening to receive a cleaning member, with said chuck members being radially movable relative to one another and having projections to be pressed into the cleaning member when the cleaning member is received within said opening, and with said cleaning member holder also including a protrusion to be pressed into an end surface of the cleaning member when the end surface is positioned within said opening; and
   a fastener adapted to be fitted around said chuck members for radially inwardly pressing said chuck members such that said chuck members securely hold the cleaning member when the cleaning member is received within said opening.

14. A cleaning device for cleaning an article, comprising:
   a stepped cleaning member to be brought into contact with a surface of an article to be cleaned, said stepped cleaning member including a first portion having a cleaning surface at its distal end to be engaged with the surface of the article to clean the article and also having a step surface at its proximal end, said stepped member also including a second portion connected to said step surface; and a cleaning member holding mechanism for holding said stepped cleaning member, wherein said cleaning member holding mechanism includes (i) a cleaning member holder having chuck members that have end surfaces to be engaged with said step surface, said chuck members defining an opening to receive said second portion, with said chuck members being laterally movable relative to one another, and (ii) a fastener adapted to be fitted around said chuck members for laterally inwardly pressing said chuck members such that said chuck members securely hold said second portion when said second portion is received within said opening.

15. The cleaning device according to claim 14, wherein said first portion has a larger cross-sectional area than that of said second portion, and said step surface comprises an annular step surface.

16. The cleaning device according to claim 15, wherein said first portion is cylindrical.

17. A cleaning device for cleaning a substrate, comprising:

a substrate holding mechanism for holding a substrate;

a cleaning member holding mechanism;

a stepped cleaning member including a first portion having a cleaning surface at its distal end to be engaged with the substrate to clean the substrate and also having an annular step surface at its proximal end, said stepped cleaning member also including a second portion connected to said annular step surface and adapted to be held by said cleaning member holding mechanism, wherein said first portion has a larger cross-sectional area than that of said second portion and said cleaning member holding mechanism is to bring said cleaning surface into contact with the substrate; and a drive mechanism for causing relative movement between the substrate, when the substrate is held by said substrate holding mechanism, and said cleaning member, when said second portion is held by said cleaning member holding mechanism, while maintaining contact between the substrate and said cleaning surface.

18. The cleaning device according to claim 17, wherein said first and second portions are each cylindrical and co-axial with one another.

* * * * *